(12) United States Patent
Best et al.

(10) Patent No.: US 6,844,244 B2
(45) Date of Patent: Jan. 18, 2005

(54) DUAL SIDED LITHOGRAPHIC SUBSTRATE IMAGING

(75) Inventors: Keith Frank Best, Prunedale, CA (US); Joseph J. Consolini, Costa Mesa, CA (US); Shyam Shinde, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/738,990

(22) Filed: Dec. 19, 2003

(65) Prior Publication Data

US 2004/0157408 A1 Aug. 12, 2004

(30) Foreign Application Priority Data

Dec. 20, 2002 (EP) .............................................. 02258834

(51) Int. Cl.[7] ............................................. H01L 21/301
(52) U.S. Cl. ...................... 438/460; 438/458; 438/459; 438/461; 438/462; 438/463; 438/455; 438/8; 438/7; 438/9; 438/5; 355/67; 355/53; 355/71; 356/401; 356/399; 356/400; 250/442.11; 250/441.11
(58) Field of Search ................................ 438/460, 458, 438/459, 461, 462, 463, 455, 8, 9, 7, 5; 355/67, 53, 71; 356/401, 399, 400; 250/442, 11, 441.11

(56) References Cited

U.S. PATENT DOCUMENTS

| 4,818,724 | A | | 4/1989 | Cetronio et al. |
| 5,004,705 | A | | 4/1991 | Blackstone |
| 5,496,616 | A | * | 3/1996 | Harris ......................... 428/172 |
| 5,523,254 | A | * | 6/1996 | Satoh et al. ................. 438/457 |
| 6,297,876 | B1 | * | 10/2001 | Bornebroek ................. 355/67 |
| 6,329,265 | B1 | * | 12/2001 | Miyawaki et al. .......... 438/401 |
| 6,498,350 | B2 | * | 12/2002 | Kwan et al. ........... 250/442.11 |
| 6,618,118 | B2 | * | 9/2003 | Minnaert et al. ............. 355/30 |
| 2002/0171818 | A1 | * | 11/2002 | Minnaert et al. ............. 355/69 |

FOREIGN PATENT DOCUMENTS

EP     1 081 748 A2     3/2001

* cited by examiner

*Primary Examiner*—Matthew Smith
*Assistant Examiner*—Victor V Yevsikov
(74) *Attorney, Agent, or Firm*—Pillsbury Winthrop LLP

(57) ABSTRACT

A device manufacturing method capable of imaging structures on both sides of a substrate, is presented herein. One embodiment of the present invention comprises a device manufacturing method that etches reversed alignment markers on a first side of a substrate to a depth of 10 µm, the substrate is flipped over, and bonded to a carrier wafer and then lapped or ground to a thickness of 10 µm to reveal the reversed alignment markers as normal alignment markers. The reversed alignment markers may comprise normal alignment patterns overlaid with mirror imaged alignment patterns.

15 Claims, 3 Drawing Sheets

DUAL SIDED LITHOGRAPHIC SUBSTRATE IMAGING

BACKGROUND OF THE INVENTION

1. Related Application

This application claims priority to European Patent Application EP 02258834.7, filed Dec. 20, 2002, which document is herein incorporated by reference.

2. Field of the Invention

The present invention relates to lithographic imaging and to lithographic device manufacturing methods.

3. Description of the Related Art

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used).

Generally, such a pattern will correspond to a particular functional layer in a device being created in the target portion, such as an integrated circuit or other device (see below). A patterning structure may be reflective and/or transmissive. Examples of patterning structure include:

mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

programmable mirror array: an example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth above.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features.

This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer.

Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, and catadioptric systems, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion", respectively.

In a lithography apparatus, it is necessary to align the mask with the substrate wafer. In other words, alignment is the process of positioning the image of a specific point on the mask to a specific point on the wafer which is to be exposed. Typically one or more alignment marks, such as a small pattern, are provided on each of the substrate and the mask. A device may consist of many layers which are built up by successive exposures with intermediate processing steps. Before each exposure, alignment between the markers on the substrate and the mask is performed to minimize any positional error between the new exposure and the previous ones, which error is termed overlay error.

For some devices, e.g. micro-electro-mechanical systems (MEMS) and micro-opto-electro-mechanical systems (MOEMS), it is desirable to be able to create structures on both sides of a substrate using lithographic processes and, in many cases, the structures on opposite sides of the substrate need to be aligned with each other. This means that it is necessary for the lithographic apparatus to align the pattern being projected onto the front side of a substrate to alignment markers on the backside.

SUMMARY OF THE INVENTION

Principles of the present invention, as embodied and broadly described herein, provide for a device manufacturing method which can image structures on both sides of substrate. In one embodiment, the method comprises providing a first substrate having a first and second surface, etching the first surface of the first substrate to a first depth with at least one alignment marker, which comprises a mirror image of a standard alignment pattern, and bonding the etched first surface of the first substrate to a second substrate. The method further comprises thinning the first substrate to a first thickness equal to or less than the first depth to reveal the at least one alignment marker and forming at least one patterned layer on the second surface of the first substrate using a lithographic projection apparatus while aligning the first substrate to the revealed at least one alignment marker.

BRIEF DESCRIPTION OF THE DRAWINGS

Embodiments of the invention will now be described, by way of example only, with reference to the accompanying schematic drawings in which.

In the figures, corresponding reference symbols indicate corresponding parts.

DETAILED DESCRIPTION

Lithographic Projection Apparatus

Figure 1:
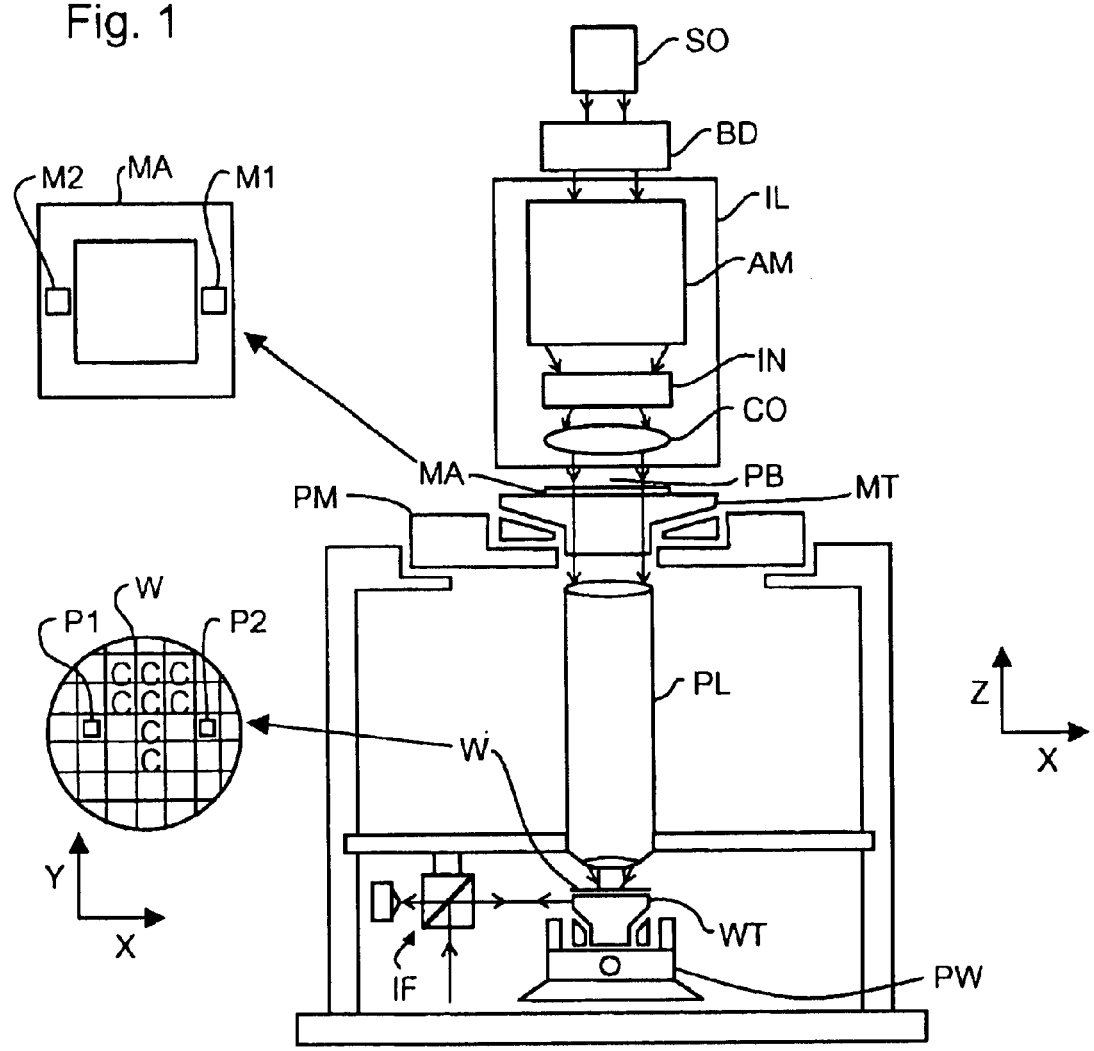
FIG. 1 depicts a lithographic projection apparatus which can be used in the method of the invention.

FIG. 1 schematically depicts a lithographic projection apparatus according to a particular embodiment of the invention. The apparatus comprises:

a radiation system SO, BD, IL: configured to supply a projection beam PB of radiation (e.g. UV radiation such as for example generated by an excimer laser operating at a wavelength of 248 nm, 193 nm or 157 nm, or by a laser-fired plasma source operating at 13.6 nm). In this particular case, the radiation system also comprises a radiation source SA;

a first object table (mask table) MT: provided with a mask holder for holding a mask MA (e.g. a reticle), and connected to first positioning mechanism PM for accurately positioning the mask with respect to item PL;

a second object table (substrate table) WT: provided with a substrate holder for holding a substrate W (e.g. a resist-coated silicon wafer), and connected to second positioning mechanism PW for accurately positioning the substrate with respect to item PL and measurement structure IF (e.g., interferometric) to accurately indicate the position of the substrate and/or substrate table with respect to lens PL; and a projection system ("lens") PL: (e.g. a quartz and/or $CaF_2$ lens system or a catadioptric system comprising lens elements made from such materials, or a mirror system) configured to image an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning mechanism, such as a programmable mirror array of a type as referred to above.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field. For example, a beam delivery system BD may include suitable directing mirrors and/or a beam expander. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable direction mirrors); this latter scenario is often the case when the source SO is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB.

Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

step mode: the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

other mode: the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

Embodiments

As indicated above, methods that can print structures on one side of a substrate aligned to markers on the other side (i.e., alternate side printing) employ optics to project an image of a backside marker to the front side of the substrate or use an alignment tool that uses a wavelength to which the substrate is transparent. However, in some circumstances it is desirable bond the substrate first side down to a carrier (or handle) wafer in order to print the second side. In that case, front-to-backside optics are of no use. Also, whilst a silicon substrate is transparent to infra-red radiation, alignment using such radiation has limited accuracy and may undesirably heat the wafer.

It has been proposed, e.g. in EP-A-1 081 748 and U.S. Pat. No. 5,004,705, to etch trenches deeply into a wafer substrates before it is flipped and bonded to a carrier. The wafer is then etched to reveal the trenches which are used for crude alignment of exposures on the topside.

Figure 2:
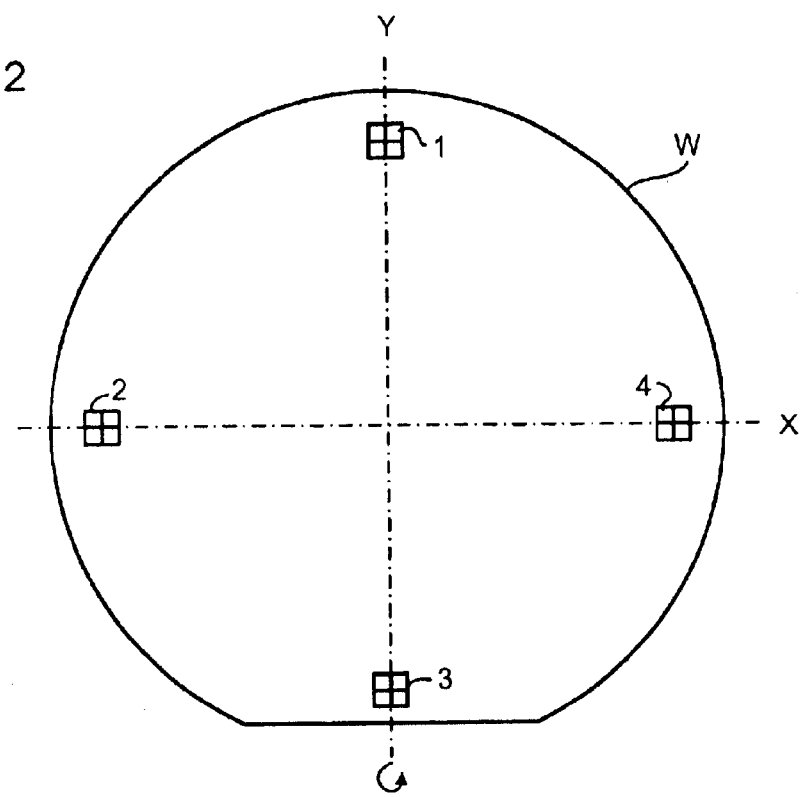
FIG. 2 is a plan view of a substrate showing the location of alignment markers used in the method of the invention.

FIG. 2 shows a wafer W which is to be provided with devices on both sides and on which are provided normal markers (not shown) and reversed markers 1–4. The reversed markers 1–4 are mirror images—about the axis about which the wafer is to be rotated, in this case the Y axis—of the normal markers. The normal markers may take any convenient form, such as a grating, a group of gratings, box-in-box, frame-in-frame, chevrons, etc., as known in the art, and may form the primary markers used for global alignment of the substrate prior to a series of exposures. In the present example the markers are provided at symmetrical positions on the wafer axes. The present invention may of course also be applied to other markers, e.g. markers adjacent each target area or die.

Figure 3:
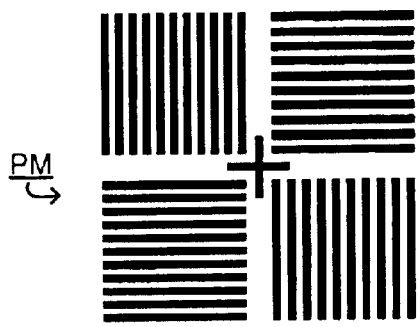
FIGS. 3 to 5 depict normal, reversed and combined alignment markers respectively.
Figure 4:
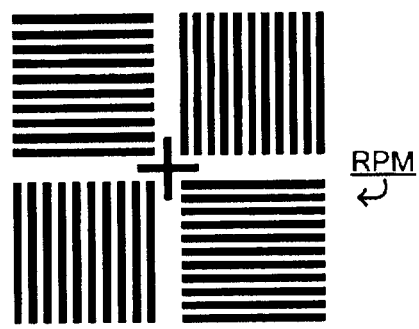
Figure 5:
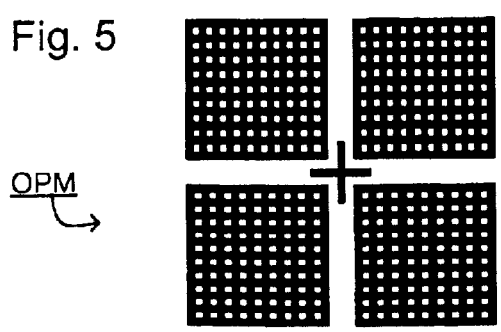

In FIG. 3, an example of a normal marker PM is shown—this comprises a group of four gratings. Of the four gratings, a pair are horizontal and a pair vertical and, though not apparent from the drawing, the two gratings of each pair have different periods in a known manner. FIG. 4 shows the corresponding reversed marker RPM which has the same four gratings but in a mirror image arrangement. The combined marker OPM is shown in FIG. 5—as can be seen, the one-dimensional gratings become two-dimensional gratings or grids.

Figure 6:
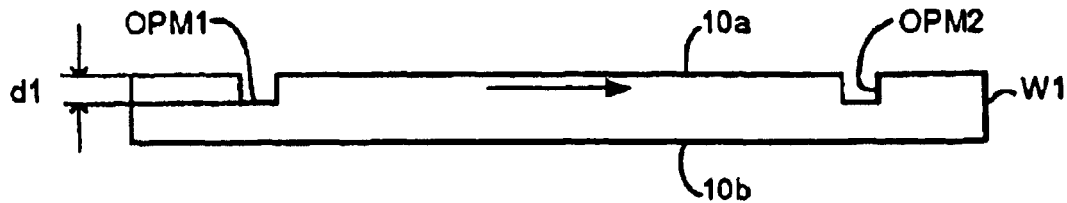
FIGS. 6 to 8 illustrate steps in a method of manufacturing devices according to the invention.
Figure 7:
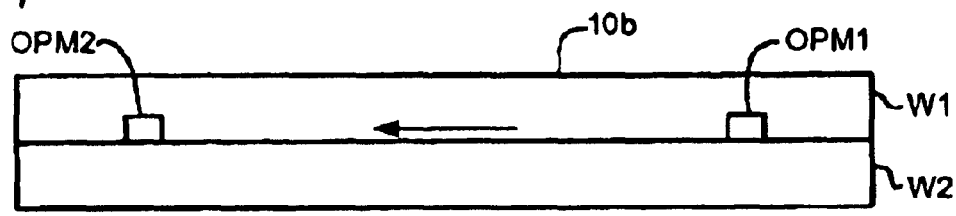
Figure 8:
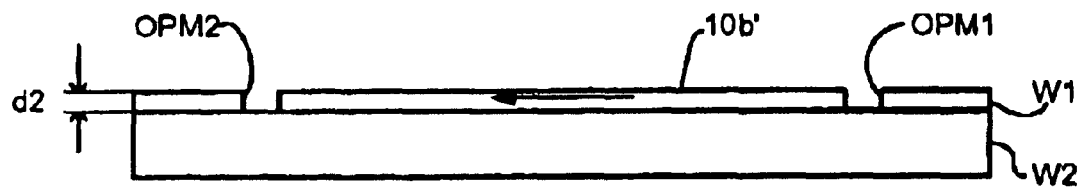

FIGS. 6 to 8 illustrate steps in an example of the method of the invention. Firstly, normal markers (not shown) and reversed markers OPM1, OPM2 are etched into first surface 10a of substrate W1 in a known manner to a depth d1 of 10 $\mu$m or more. Exposures and other process steps to form desired devices on the first surface are then performed. The substrate W1 is then flipped over and bonded to carrier substrate W2 with a layer of adhesive. FIG. 7 shows the substrate W bonded to the carrier substrate CW, with the second surface 10b uppermost.

As shown in FIG. 8, the wafer W is ground or lapped to a desired thickness, d2, e.g. of about 10 $\mu$m or less, and the upper surface 10b' finished as required for the devices to be formed on it. At this stage, the reversed markers 1–4, which were etched to a depth of 10 $\mu$m or more into the first surface are revealed in the second surface and can be aligned to in a known manner.

Suitable alignment systems and processes which can be used to align to the revealed reversed markers are described in WO 98/39689, which document is incorporated herein by reference. After alignment of the markers, at least one patterned layer (e.g. as shown in FIG. 1) can also be formed on the second surface of the first substrate, e.g. to construct additional devices.

If the combined marker shown in FIG. 5 is used, alignment to it can be performed from both sides of the substrate ensuring direct alignment of structures on opposite sides of the substrates, without the need for offsets.

The alignment marker formed in the first surface is revealed by the etch as a normally oriented alignment marker to which the lithographic projection apparatus can readily align. Patterns directly aligned to the marker printed on the frontside can therefore be printed on the backside of the substrate. The standard alignment pattern is one to which an alignment tool in the lithographic apparatus used for imaging can align. It may be, for example, a group of gratings of different orientations and pitches. Other patterns may also be used.

The present invention thus avoids the need for an additional step of printing alignment markers on the second surface of the substrate prior to the formation of process layers.

The alignment marker comprising the mirror image of the alignment pattern may also comprise a normal image of said alignment pattern overlaid on the mirror image. This produces a single alignment marker that can be aligned to during exposures on both sides of the substrate ensuring alignment between structures on the two sides. In the case of an alignment mark comprising a group of gratings, this turns the linear gratings into grids.

Figure 7A:
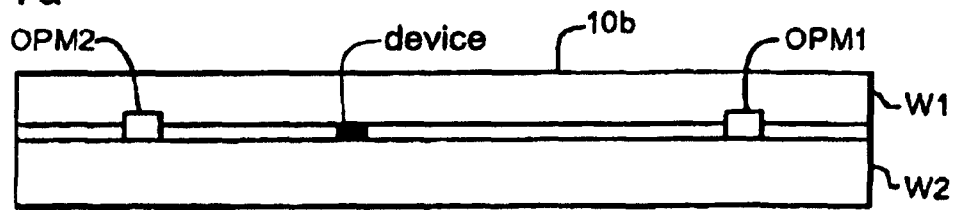
FIG. 7a represents a cross-section of a first substrate bonded to a second substrate according to an embodiment of the invention.

Before the substrate is bonded to the second (carrier) substrate, devices may be formed in and/or on the first surface using known techniques. FIG. 7a represents a cross-section of a first substrate bonded to a second substrate according to an embodiment of the invention. In FIG. 7a, a device has been formed on the first surface of the first substrate before the first substrate is bonded to the second (carrier) substrate.

Normal alignment markers for use in aligning the structures in or on the first surface can be printed in the same step as the reverse alignment markers used to align the structures formed on the second surface. In this way, the positional relationship of the normal and reversed markers and hence of the structures on the first and second surfaces can be assured.

The reduction in thickness may be effected by lapping or grinding.

The first depth may be of the order of 10 $\mu$m or more and the first thickness may be of the order of 10 $\mu$m or less.

Whilst specific embodiments of the invention have been described above, it will be appreciated that the invention may be practiced otherwise than as described. The embodiments described above may, instead, be implemented in different embodiments of software, firmware, and hardware in the entities illustrated in the figures.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A device manufacturing method, comprising:

providing a first substrate having a first and second surface;

etching said first surface of said substrate to a first depth with at least one alignment marker, said at least one alignment marker comprising a mirror image of a standard alignment pattern;

bonding said etched first surface of said first substrate to a second substrate;

thinning said first substrate to a first thickness equal to or less than said first depth to reveal said at least one alignment marker; and forming at least one patterned layer on said second surface of said first substrate using a lithographic projection apparatus while aligning said first substrate to said revealed at least one alignment marker.

2. The method of claim 1, wherein said at least one alignment marker further comprises a normal image of said standard alignment pattern overlaid on said mirror image of said standard alignment pattern.

3. The method of claim 2, wherein said standard alignment pattern comprises a set of one dimensional gratings.

4. The method of claim 1, wherein said first depth is 10 $\mu$m or more and said first thickness is 10 $\mu$m or less.

5. The method of claim 1, wherein said thinning of said first substrate comprises at least one of lapping and grinding.

6. The method of claim 1 wherein, prior to said bonding, forming a device on said first surface.

7. The method of claim 1, wherein said at least one alignment marker is patterned using the same apparatus as is used for patterning a process layer.

8. The method of claim 1, wherein said forming at least one patterned layer on said second surface includes forming at least one further alignment marker at a known position relative to said revealed at least one alignment marker.

9. A device manufacturing method comprising:
providing a first substrate having a first surface on a first side and a second surface on a second side;
etching said first surface of said substrate to a first depth with at least one alignment marker, said at least one alignment marker comprising a normal image of a standard alignment pattern overlaid on a mirror image of said standard alignment pattern;
bonding said etched first surface of said first substrate with a second substrate such that said etched first surface faces said second substrate;
thinning said first substrate to a first thickness equal to or less than said first depth to reveal said at least one alignment marker; and
forming at least one patterned layer on said second surface of said first substrate using a lithographic projection apparatus while aligning said first substrate to said revealed at least one alignment marker.

10. The method of claim 9, wherein said standard alignment pattern comprises a set of one dimensional gratings.

11. The method of claim 9, wherein said first depth is 10 $\mu$m or more and said first thickness is 10 $\mu$m or less.

12. The method of claim 9, wherein said thinning of said first substrate comprises at least one of lapping and grinding.

13. The method of claim 9 wherein, prior to said bonding, forming a device on said first surface.

14. The method of claim 9, wherein said at least one alignment marker is patterned using the same apparatus as is used for patterning a process layer.

15. The method of claim 9, wherein said forming at least one patterned layer on said second surface includes forming at least one further alignment marker at a known position relative to said revealed at least one alignment marker.

* * * * *